United States Patent [19]
Jun et al.

[11] 3,836,368
[45] Sept. 17, 1974

[54] PHOTOPOLYMERIZABLE ELEMENT COMPRISING A CONJUGATED DIACETYLENE LAYER ON THE PHOTOPOLYMER LAYER

[75] Inventors: Mong-Jon Jun; Klaus Penzien, both of Ludwigshafen; Gerhard Wegner, Ingelheim, all of Germany

[73] Assignee: Badische Anilin- & Soda-Fabrik Aktiengesellschaft, Ludwigshafen/Rhein, Germany

[22] Filed: Sept. 20, 1972

[21] Appl. No.: 290,709

[52] U.S. Cl. .......... 96/69, 96/68, 96/36.3, 96/35.1, 96/44

[51] Int. Cl. .......... G03c 1/76, G03c 3/00

[58] Field of Search .......... 96/68, 69, 36.3, 35.1, 96/44

[56] References Cited

UNITED STATES PATENTS

| | | | |
|---|---|---|---|
| 2,760,863 | 8/1956 | Plambeck | 96/36.3 |
| 3,442,648 | 5/1969 | Smith | 96/68 |
| 3,451,816 | 6/1969 | Williams et al. | 96/68 |
| 3,501,297 | 3/1970 | Cremeans | 96/48 R |
| 3,501,302 | 3/1970 | Foltz | 96/48 R |
| 3,501,303 | 3/1970 | Foltz et al. | 96/88 |
| 3,501,308 | 3/1970 | Adelman | 96/48 R |
| 3,723,121 | 3/1973 | Hauser | 96/48 R |

*Primary Examiner*—Ronald H. Smith
*Assistant Examiner*—Edward C. Kimlin
*Attorney, Agent, or Firm*—Johnston, Keil, Thompson & Shurtleff

[57] ABSTRACT

Photopolymer printing plates having, on top of a photosensitive layer (*a*) attached to a base, a thin layer (*b*) of a suspension of finely crystalline conjugated diacetylene compounds in a binder, which compounds change color when photopolymerized. Such printing plates make possible the production of positive copies of a positive transparency by producing in layer (*b*) an image with areas which do not transmit light by exposure to light having a wavelength of less than 320 mμ and optional fixing, and initiating photopolymerization in layer (*a*) by exposing it through the said image to light having a wavelength of from 320 to 450 mμ and then washing out the unexposed areas of layer (*a*).

8 Claims, No Drawings

PHOTOPOLYMERIZABLE ELEMENT COMPRISING A CONJUGATED DIACETYLENE LAYER ON THE PHOTOPOLYMER LAYER

The present invention relates to a process for the production of printing plates, wherein a dimensionally stable base is provided with a photosensitive layer to which there is applied a layer of a suspension of photopolymerizable diacetylene compounds in the form of fine crystals in a binder, and the printing relief is produced by exposure followed by washout of the unexposed areas. The invention relates in particular to the production of printing plates using either a negative or positive transparency.

Photosensitive plates for the production of printing plates, particularly letterpress and lithographic printing plates, in which a photosensitive layer attached to a base and containing, for example, photopolymerizable ethylenically unsaturated compounds is polymerized by exposing it to light through an image-bearing transparency, and the unexposed areas are subsequently washed out with a solvent, are described, for example, in U.S. Pat. No. 2,760,863, French Pat. No. 1,588,734 and German Published Application No. 1,572,153. However, a disadvantage of such plates is that they can only be exposed through a negative transparency, which is a considerable restriction because negative transparencies are not always suitable.

When a positive transparency is used, a printing plate working, for example, on the principle of photodecomposition of diazo compounds must be employed. It is impossible to expose a lithographic printing plate working on this principle through a negative transparency because the negative image forms the printing relief. Positive photopolymer letterprss printing plates which can be exposed through a positive transparency have not hitherto been described. Such a printing plate can only be produced by reversing the transparency, which requires special equipment.

German Published Application No. 1,547,651 discloses a process for the production of images by photopolymerizing polyacetylene compounds, wherein photosensitive crystalline polyacetylene compounds distinctly change their color when exposed.

German Published Application No. 1,940,690 describes a process for the production of images, wherein the changes in color of crystalline diynes having conjugated triple bonds, particularly derivatives of hexadiyne-2,4-diol-1,6, brought about by photopolymerization are used to produce images.

The principle on which the said published applications are based is that of the topochemical polymerization of solid crystalline diacetylene compounds, colored polymer crystals composed of polyenyne structures being formed, which has recently been confirmed by three-dimensional X-ray structural analysis in the case of polyhexadiyne-2,4-diol-1,6-bisphenylurethane (cf. E. Hadicke et al, Angew. Chemie, 83, 253 (1971)).

An object of the present invention is to provide a process for the production of photopolymer printing plates which can be exposed through either a positive or negative transparency, the printed copy always being a positive of the image-bearing transparency due solely to appropriate choice of the exposure conditions.

We have now found that the production of printing plates by exposing through an image-bearing transparency a photosensitive layer ($a$) which is solid at room temperature and attached to a dimensionally stable base and which can be polymerized by light having a wavelength of from about 320 to 450 m$\mu$, and washing out the unexposed areas with a solvent can be advantageously carried out by applying a photopolymerizable layer ($a$) a layer ($b$) of a suspension of finely crystalline photopolymerizable conjugated diacetylene compounds in a polymeric binder, exposing said layer ($b$) through an image-bearing transparency to light which has a wavelength of less than about 320 m$\mu$ and which does not initiate polymerization in said layer ($a$) but produces an image in said layer ($b$), optionally fixing said image, exposing said layer ($a$) through the image produced in said layer ($b$) to light having a wavelength of from about 320 to 450 m$\mu$ and removing the unexposed areas in layer ($a$) and the whole layer ($b$) by washout.

The photosensitive printing plate of the invention comprises a dimensionally stable base, a photopolymerizable layer ($a$) and a layer ($b$) consisting of a suspension of photosensitive conjugated diacetylene compounds in the form of fine crystals in a polymeric binder.

Suitable bases are, for example, dimensionally stable rigid or flexible sheets of metal, wood, plastics materials and paper.

The photopolymerizable layer ($a$) has a basic composition such as is described, for example, in U.S. Pat. No. 2,760,,863, French Pat. No. 1,588,734 and German Published Application No. 1,572,153 for photopolymer layers and photopolymer printing plates.

Particularly suitable monomers are those which have boiling points above 100° C and predominantly at least two olefinically unsaturated double bonds. Preferred monomers include diacrylates and methacrylates of dihydric alcohols, such as diacrylates of glycol, propylene glycols, butylene glycols and the glycols of higher alcohols, such as pentanediols and hexanediols, and diacrylates and polyacrylates of polyfunctional alcohols, such as glycerol, pentaerythritol and trimethylolpropane. Diacrylamides, polyacrylamides, dimethacrylamides and polymethacrylamides of di- and poly-amines may of course be used instead of these diacrylates and polyacrylates. Such amines are, for example, ethylenediamine, propylenediamines and butylenediamines. Corresponding urea, melamine and guanidine derivatives having two or more acrylyl or methacrylyl radicals are also suitable for this purpose, e.g. diacrylyl urea, dimethacrylyl urea, methylenebisacrylamide and methylenebismethacrylamide. Monomers containing urethane groups may also be used. Moreover, derivatives of vinyl ethers or vinyl esters are also suitable for this purpose.

Photoinitiators serve to increase the photosensitivity of the photopolymerizable mixtures. Examples of such photoinitiators are vicinal ketaldonyl compounds such as diacetyl and benzil; $\alpha$-ketaldonyl alcohols such as benzoin; acyloin ethers such as benzoin methyl ether; $\alpha$-substituted aromatic acyloins and their ethers such as $\alpha$-methylbenzoin and $\alpha$-methylolbenzoinmethyl ether; and derivatives of anthraquinone. The action of these photoinitiators is based on their ability to decompose with the formation of free radicals after absorbing light particularly in the region of the spectrum having a wavelength of from 320 to 370 m$\mu$, thus initiating polymerization, i.e., crosslinking, of the olefinically unsaturated compounds.

The photopolymerizable mixtures may also contain inhibitors to prevent a thermal polymerization reaction. These inhibitors prevent the premature polymerization of the photosensitive mixtures, for example during manufacture and storage. When the said mixtures are exposed to actinic light, the inhibitors bring about an induction period following which polymerization proceeds at the same rate as when no inhibitor is used. Examples of inhibitors which may be used are quinones, phenols, amines, dyes, copper (I) chloride, α-naphthylamine, nitrites, nitroaromatics and derivatives of N-nitrosohydroxylamine and urea.

Photosensitive crystalline diacetylene compounds having conjugated triple bonds which have polar groups on both sides of the rigid conjugated system in the molecule are particularly suitable for layer (*b*) which consists of a suspension of photosensitive diacetylene compounds in the form of fine crystals in a polymeric binder. In particular, polar groups such as urethane groups, ester groups, carboxyl groups and sulfonate groups facilitate the formation of directed secondary valence bonds and thus contribute toward a distinct increase in the polymerization rate of the diacetyl compounds. Diacetylene compounds having a high rate of photopolymerization are preferred.

As a result of exposure of the diacetylene compounds through an image-bearing transparency, there is first of all formed in layer (*b*) a colored image which is fixed by thermal treatment or treatment with a solvent. In order to produce a good printing relief in layer (*a*) using this colored image as image-bearing transparency, it is essential that the said image should not transmit light which initiates polymerization in layer (*a*).

It is known from the abovementioned German Published Application No. 1,547,651 that films containing conjugated diacetylene compounds turn blue or red when exposed; the color can for example change from blue to predominantly red following treatment with solvents. Such polyacetylene-containing films transmit light having a wavelength of from 320 to 450 mμ to a substantial extent and therefore cannot be used according to the invention in layer (*b*). Only those diacetylene compounds can be used whose polymers obtained by exposure, following an optional thermal treatment and/or treatment with a solvent do not transmit any appreciate amount of light having a wavelength of from about 320 to about 450 mμ which is required to photopolymerize layer (*a*).

Fixation can be effected by thermal treatment at a temperature of from about 60° to 150° C, preferably from 70° to 100° C, for a period of from about 30 seconds to 12 minutes. At temperatures above the temperature range of 110° to 120° C fixation is completed within seconds.

Fixation can also be effected by treatment with an organic solvent. Suitable solvents are those which readily dissolve the diyne compounds and which are capable of penetrating layer (*b*) in the manner of a swelling process. Preferred solvents are ketones, such as acetone and methyl ethyl ketone, and chlorinated hydrocarbons, such as chloroform and trichloroethane.

Diacetylene compounds which are particularly suitable can be rapidly photopolymerized by exposure through an image-bearing transparency to UV-light having a wavelength of from about 220 to 320 mμ to form a colored image. The resulting polyen-ynes, after fixation, absorb light of the region of the spectrum having a wavelength of from about 320 to 450 mμ to the extent of at least 90 percent.

The requirements for the production of an image in layer (*b*) which does not transmit light of the specified wavelength range are fulfilled in particular by hexadiyne-2,4-diol-1,6-bis-*n*-alkyl urethanes having in particular two to 10 carbon atoms in the alkyl radical. Hexadiyne-2,4-diol-1,6-bis-*n*-hexyl urethane, hexadiyne-2,4-diol-1,6-bis-*n*-heptyl urethane and hexadiyne-2,4-diol-1,6-bis-*n*-octyl urethane have proved to be suitable.

The choice of the polymeric binder as matrix for the finely crystalline diacetylene compound is governed mainly by the following criteria, namely (*a*) that the binder should not dissolve the diyne crystals at room temperature and (*b*) that it should transmit actinic light. The solvent containing the polymeric binder and the diyne suspension should of course not dissolve or attack layer (*a*). In the light of these criteria, polyvinylpyrrolidones having a K value of 70 to 90 (according to Fickentscher, Cellulosechemie, 13, 60 (1932) such as are marketed under the registered trademark LUVISKOL (product of Badische Anilin- & Soda-Fabrik AG, 6700 Ludwigshafen, Germany)) have proved to be particularly suitable.

Layer (*b*) generally consists of 5 to 80 percent, preferably 30 to 60 percent, by weight of diacetylene compound and 20 to 95 percent, preferably 40 to 70 percent, by weight of a polymeric binder which transmits light of the specified wavelength. Layer (*b*) generally has a thickness of 2 to 100 μ, whereas layer (*a*) has a thickness of from 2 to 1,000 μ depending on whether the plate is to be used for lithographic or letterpress printing.

As pointed out above, those diacetylene compounds are suitable which photopolymerize at a fast enough rate and whose polymers satisfy the specified spectral requirements. The suitability of a diacetylene compound can be checked in a simple manner by irradiating a layer of the compound in a polymeric binder for a short time with a low-pressure mercury vapor lamp and then, after optional heating and/or treatment with a solvent, checking the imperviousness of the layer (*b*) containing the polymer crystals to light of a wavelength of up to 450 mμ by measuring the UV and visible regions of the spectrum.

The printing plates of the invention can be produced in a conventional manner, for example as described in the abovementioned patents relating to photopolymer printing plates. Layer (*b*) is applied to layer (*a*) in the same way as or in a similar manner to that used to apply layer (*a*) to the base.

The main advantage of the process according to the invention is that the printer has at his disposal a photosensitive plate which can be exposed directly through an image-bearing transparency, e.g. a positive transparency, the printed copy obtained being a positive of the image-bearing transparency without any troublesome reversal of the transparency being necessary. Alternatively, to produce a positive printed copy, the photosensitive plate of the invention can be exposed through a negative transparency using light of a wavelength of from about 320 to 450 mμ which is transmitted by the layer containing the acetylene compound and initiates photopolymerization only in layer (*a*).

To prepare a plate which prints, for example, positive copies of a positive transparency, an image is first of all produced in layer (*b*), for example, by exposure to light having a wavelength of 254 mμ from a low-pressure mercury vapor lamp. Any light transmitted by layer (*b*) does not initiate photopolymerization in layer (*a*) because the above-described photoinitiators are not effective at all or only slightly effective when subjected to light of this wavelength. The resulting image consisting of polymerized acetylenesis then converted into a form which is impervious to light having a wavelength of from about 320 to 450 mμ by heating and/or treatment with a solvent, for example by dipping or passing over solvent vapor. Layer (*a*) is then exposed through the image in layer (*b*) with light of a wavelength of from about 320 to 450 mμ. Finally, the unexposed, i.e., non-crosslinked, areas in layer (*a*) and the whole layer (*b*) are washed out with a conventional solvent or solvent mixture to obtain the printing relief.

The production of a positive printing plate using a positive transparency can be carried out with one source of light by effecting polymerization of layer (*b*) and layer (*a*) successively. The diacetylene compounds are photopolymerized during the first exposure of short duration using light having a wavelength of from about 305 to 450 mμ; the light passing through layer (*b*) cannot initiate any photopolymerization in layer (*a*) in such a short time because of the presence of the inhibitor. The plate is then heated and/or treated with a solvent, the non-photopolymerized diacetylenes losing their photosensitivity and the polyacetylenes in the exposed areas becoming impervious to light. Afterwards, the second exposure of longer duration using light of approximately the same wavelength is effected; this first of all uses up the inhibitor in layer (*a*) and then initiates photopolymerization, i.e., photocrosslinking, therein. Washout is then carried out in a conventional manner using a conventional solvent or solvent mixture to produce the printing relief.

To produce a printing plate which prints negative copies of the image-bearing transparency, the blank material comprising layers (*a*) and (*b*) is exposed to light having a wavelength of from about 320 to 450 mμ, the image in layer (*b*) not being fixed. In this case a flat-plate exposure unit manufactured by Fa. Moll, SolingenWald, Germany and having a bank of fluorescent tubes (Sylvania BL-40 W) can for example be used as light source. If necessary, layer (*b*) can be protected by covering it with a sheet of glass or plastic film which filters out light having a wavelength of up to 320 mμ.

It should be emphasized that not only transparencies but also any other type of pattern used in the art for reproduction purposes can be employed in the process of the invention.

The invention is illustrated by the following Examples in which parts and percentages are by weight unless otherwise stated. Parts by weight bear the same relation to parts by volume as the kilogram to the liter.

EXAMPLE 1

1 part of polyvinylpyrrolidone (Luviskol K 90, product of Badische Anilin- & Soda-Fabrik AG) and 0.75 part of hexadiyne-2,4-diol-1,6-bis-*n*-hexyl urethane having a melting point of 85° C are dissolved in seven parts by volume of methanol. To produce a crystalline suspension, two parts by volume of water is added. This suspension is applied to sheets of glass using a 300 μ doctor blade, a film full of crystals which slowly turns red in daylight being formed.

The film turns red within a fraction of a second when exposed to light of a wavelength of 254 mμ and within 30 to 60 seconds when exposed to light having a wavelength of from 305 to 370 mμ.

EXAMPLE 2

A film freshly prepared according to Example 1 is exposed through an image-bearing transparency and then dipped into trichloroethane for 1 second. The color of the exposed polyacetylene-containing areas of the film changes from red to black during this treatment, and the unexposed areas transmit light having a wavelength above 300 mμ and are not affected by any kind of irradiation.

EXAMPLE 3

A film prepared according to Example 1 is exposed through an image-bearing transparency and then heated at 86° C for 5 minutes. During this treatment the color of the exposed polyacetylene-containing areas turns from red to black; the unexposed areas are not affected by any kind of irradiation for several hours.

EXAMPLE 4

The aqueous suspension of hexadiyne-2,4-diol-1,6-bis-*n*-hexyl urethane containing polyvinylpyrrolidone according to Example 1 is applied, as layer (*b*), to a photopolymer letterpress printing plate prepared according to French Pat. No. 1,588,734 using a 300 μ doctor blade. After evaporation of the solvent, a pattern is placed in contact with the plate and exposure is effected for 1 second using light of a wavelength of 254 mμ. The red negative of the pattern formed in layer (*b*) is then turned black by heating at 86° C for 4 minutes or by spraying with acetone, the unexposed areas in layer (*b*) losing their photosensitivity. Exposure is then effected for 5 minutes using light of a wavelength of 320 mμ, the image produced in layer (*b*) acting as image-bearing transparency. Finally the plate is washed out with the aqueous alkaline solution described in French Pat. No. 1,588,734 to remove the unexposed areas of layer (*a*) and the whole layer (*b*). After drying the resulting printing plate, about 500 printed copies of very good quality are pulled on a proofing press.

EXAMPLE 5

An aqueous suspension containing 1 part of the polyvinylpyrrolidone described in Example 1 and 0.75 part of hexadiyne-2,4-diol-1,6-bis-*n*-hexyl urethane is applied to a photopolymer letterpress printing plate according to French Pat. No. 1,588,734 in such an amount that a layer of polyvinylpyrrolidone and hexadiyne-2,4-diol-1,6-bis-*n*-hexyl urethane 40 μ in thickness is obtained after evaporation of the water. The plate is then exposed for 60 seconds through a halftone positive in a conventional flat-plate exposure unit for reproduction purposes provided with a bank of fluoroescent tubes (Sylvania 40W) emitting light having a wavelength of from 305 to above 450 mμ. The red negative image formed in layer (*b*) is turned into a black one by heating at 86° C for 4 minutes. Layer (*a*) is then exposed for 12 minutes through the said black image for 12 minutes in the same exposure apparatus, i.e., to light of the same wavelength range, and washed out with the solvent indicated in Example 4 to produce the relief image. After drying the resulting printing plate, about 100 printed copies of excellent quality are pulled on a proofing press.

EXAMPLE 6

The following are dissolved in 300 parts by volume of dioxane:

| | |
|---|---|
| 15 | parts of hydroxypivalic acid/neopentyl glycol polyester; |
| 5 | parts of styrene/maleic acid copolymer (about 1:1); |
| 3 | parts of benzoin methyl ether; |
| 25 | parts of butanediol-1,4 diacrylate; |
| 0.05 | part of methyl violet; and |
| 0.50 | part of thiourea. |

This solution is sprayed onto a commercially available sheet of aluminum used for lithographic purposes in such an amount that a layer (layer (*a*)) 2.5$\mu$ in thickness is produced after drying for 10 minutes in a through-circulation dryer at 45°C. The plate is then coated with such an amount of an aqueous suspension of one part of hexadiyne-2,4-diol-1,6-bis-*n*-hexyl urethane and one part of the polyvinylpyrrolidone employed in Example 1 that, after drying, a top layer (layer (*b*)) 3$\mu$ in thickness is obtained. The resulting plate is exposed through a halftone positive in a flat-plate exposure unit for 30 seconds and then heated at 86° C for 3 minutes to produce a black image in layer (*b*). Afterwards layer (*a*) is exposed through the said black image for 4 minutes and washed out with 0.25 percent aqueous caustic solution to obtain the printing relief. When mounted on a small offset press, the resulting lithographic printing plate produces more than 3,000 impressions of uniformly excellent quality.

EXAMPLE 7

To obtain a plate which prints negative copies of the imagebearing transparency, the procedure of Examples 4 to 6 is followed but without producing a black image in layer (*b*).

We claim:

1. A photopolymerizable element for use in preparing printing plates which comprises in combination: a base which is dimensionally stable; a layer (*a*) attached to said base, said layer (*a*) being solid at room temperature and further being polymerizable by light having a wavelength of from about 320 to 450 m$\mu$; and a layer (*b*) applied to said layer (*a*) of a suspension of a binder and a finely crystalline conjugate diacetylene compounds which change color when photopolymerized using light of a wavelength of less than about 320 m$\mu$, and upon fixing do not transmit any appreciable amount of light having a wavelength of from about 320 m$\mu$ to about 450 m$\mu$.

2. A photopolymerizable element as set forth in claim 1 wherein the photopolymerized acetylenes in layer (*b*), after fixation, absorb light of the region of the spectrum having a wavelength of from about 320 to 450 m$\mu$ to the extent of at least 90 percent.

3. A photopolymerizable element as set forth in claim 1 wherein the photopolymerizable diacetylene compounds contained in layer (*b*) are urethanes of hexadiyne-2,4-diol-1,6.

4. A photopolymerizable element as set forth in claim 1 wherein the diacetylene compound present in layer (*b*) is hexadiyne-2,4-diol-1,6-bis-n-hexyl urethane.

5. A photopolymerizable element as set forth in claim 1 wherein layer (*b*) consists of 5 to 80 percent by weight of diacetylene compound and 20 to 95 percent by weight of a polymeric binder which transmits light of a wavelength of more than 250 m$\mu$.

6. A photopolymerizable element as set forth in claim 1 wherein the polymeric binder present in layer (*b*) is a polyvinylpyrrolidone having a K value of 70 to 90.

7. A photopolymerizable element as set forth in claim 1 wherein said layer (*b*) has a thickness of from 2 to 100 $\mu$.

8. A photopolymerizable element as set forth in claim 1 wherein said layer (*b*) has a thickness of from 2 to 100 and wherein said layer (*a*) has a thickness of from 2 to 1,000 $\mu$.

* * * * *

UNITED STATES PATENT AND TRADEMARK OFFICE
CERTIFICATE OF CORRECTION

PATENT NO. : 3,836,368

DATED : September 17, 1974

INVENTOR(S) : Mong-Jon Jun, Klaus Penzien, and Gerhard Wegner

It is certified that error appears in the above-identified patent and that said Letters Patent are hereby corrected as shown below:

In Column 1, in the heading, insert--[30] Foreign Application Priority Data, October 1, 1971, Germany, P 21 49 055.1--.

Signed and Sealed this

*twenty-fifth* Day of *November 1975*

[SEAL]

*Attest:*

RUTH C. MASON
*Attesting Officer*

C. MARSHALL DANN
*Commissioner of Patents and Trademarks*